United States Patent
Zheng et al.

(10) Patent No.: US 11,576,266 B2
(45) Date of Patent: Feb. 7, 2023

(54) MULTILAYER SCREEN PRINTING STENCIL

(71) Applicant: International Business Machines Corporation, Armonk, NY (US)

(72) Inventors: Jia Yu Zheng, Foshan (CN); WeiFeng Zhang, Shenzhen (CN); YanLong Hou, Shenzhen (CN); Guo Wei, Shenzhen (CN); Zhipeng Wang, Zhongshan (CN); Miao Zhang, Shenzhen (CN)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 17/010,952

(22) Filed: Sep. 3, 2020

(65) Prior Publication Data

US 2022/0071017 A1 Mar. 3, 2022

(51) Int. Cl.
  *B41N 1/24* (2006.01)
  *H05K 3/12* (2006.01)
  *H05K 3/34* (2006.01)
  *B41M 1/12* (2006.01)

(52) U.S. Cl.
  CPC .............. *H05K 3/1225* (2013.01); *B41N 1/24* (2013.01); *H05K 3/1233* (2013.01); *H05K 3/3478* (2013.01); *B41M 1/12* (2013.01)

(58) Field of Classification Search
  CPC ....................................................... B41N 1/24
  See application file for complete search history.

(56) References Cited

U.S. PATENT DOCUMENTS

| 4,242,401 A * | 12/1980 | Mitani | B41M 1/12 428/209 |
|---|---|---|---|
| 6,096,131 A | 8/2000 | Hewett | |
| 6,584,897 B2 | 7/2003 | Cobbley et al. | |
| 6,988,652 B2 | 1/2006 | Fleck et al. | |
| 2004/0165362 A1 * | 8/2004 | Farnworth | H01L 24/02 361/764 |

FOREIGN PATENT DOCUMENTS

| DE | 102011101158 A1 | 12/2011 | |
| DE | 102011110653 A1 | 3/2012 | |
| DE | 102016220678 A1 * | 4/2018 | ........... B23K 1/0008 |
| WO | 2002080636 A1 | 10/2002 | |
| WO | WO-2006062457 A1 * | 6/2006 | ............... B41N 1/24 |

OTHER PUBLICATIONS

Shea, "Troubleshooting the Stencil Printing Process", Shea Engineering Services, printed Jul. 13, 2020, 44 pages.

* cited by examiner

*Primary Examiner* — Matthew G Marini
*Assistant Examiner* — Marissa Ferguson-Samreth
(74) *Attorney, Agent, or Firm* — Jeffrey M. Ingalls

(57) ABSTRACT

A method of forming solder paste on an object is provided. The method includes providing a multilayered stencil, each stencil layer having an aperture formed therethrough from a top surface of the respective stencil layer to a bottom surface of the stencil layer. The method also includes applying the stencil to a surface of the object. The method also includes filling a void space formed by a combination of the apertures in the stencil layers with solder paste. The method also includes removing the stencil layers in a sequential manner to leave the solder paste.

9 Claims, 6 Drawing Sheets

MULTILAYER SCREEN PRINTING STENCIL

BACKGROUND

The present disclosure relates to the electrical, electronic and computer fields. In particular, the present disclosure relates to the use of screen printing stencils. Screen printing stencils are used in a wide variety of applications in the electronic substrate fabrication and electronic assembly industry for applying materials such as photo resist or solder paste.

As the size of the features of a semiconductor device continues to decrease, greater precision is required in order to apply viscous material to the surface thereof. This includes the application of solder paste to the surface of a printed circuit board or die for securing, for example, a flip chip thereto. Metal stencils are currently utilized to apply the solder paste onto the surface for connecting the contact pads of surface mounted flip chips. These stencils typically have a plurality of apertures that are formed in the stencil in certain locations that correspond to the pattern of the contact pads on the printed circuit board of choice.

In use, these stencils are positioned near or on the surface of the printed circuit board, the apertures in the stencil are aligned over the contact pads upon which the solder paste is to be applied, the solder paste is then urged mechanically through the apertures via a wiper, and the stencil is removed, leaving small islands of solder paste remaining on the contact pads of the printed circuit board.

SUMMARY

Embodiments of the present disclosure relate to a method of forming solder paste on an object is provided. The method includes providing a multilayered stencil, each stencil layer having an aperture formed therethrough from a top surface of the respective stencil layer to a bottom surface of the stencil layer. The method also includes applying the stencil to a surface of the object. The method also includes filling a void space formed by a combination of the apertures in the stencil layers with solder paste. The method also includes removing the stencil layers in a sequential manner to leave the solder paste.

Other embodiments relate to a multilayered stencil for applying solder paste to a surface of an object. The stencil includes a plurality of stencil layers formed in a stacked configuration, each stencil layer having an aperture formed therethrough from a top surface of the respective stencil layer to a bottom surface of the stencil layer. The aperture sizes of the stencil layers gradually decrease in a direction away from the surface of the object.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1:
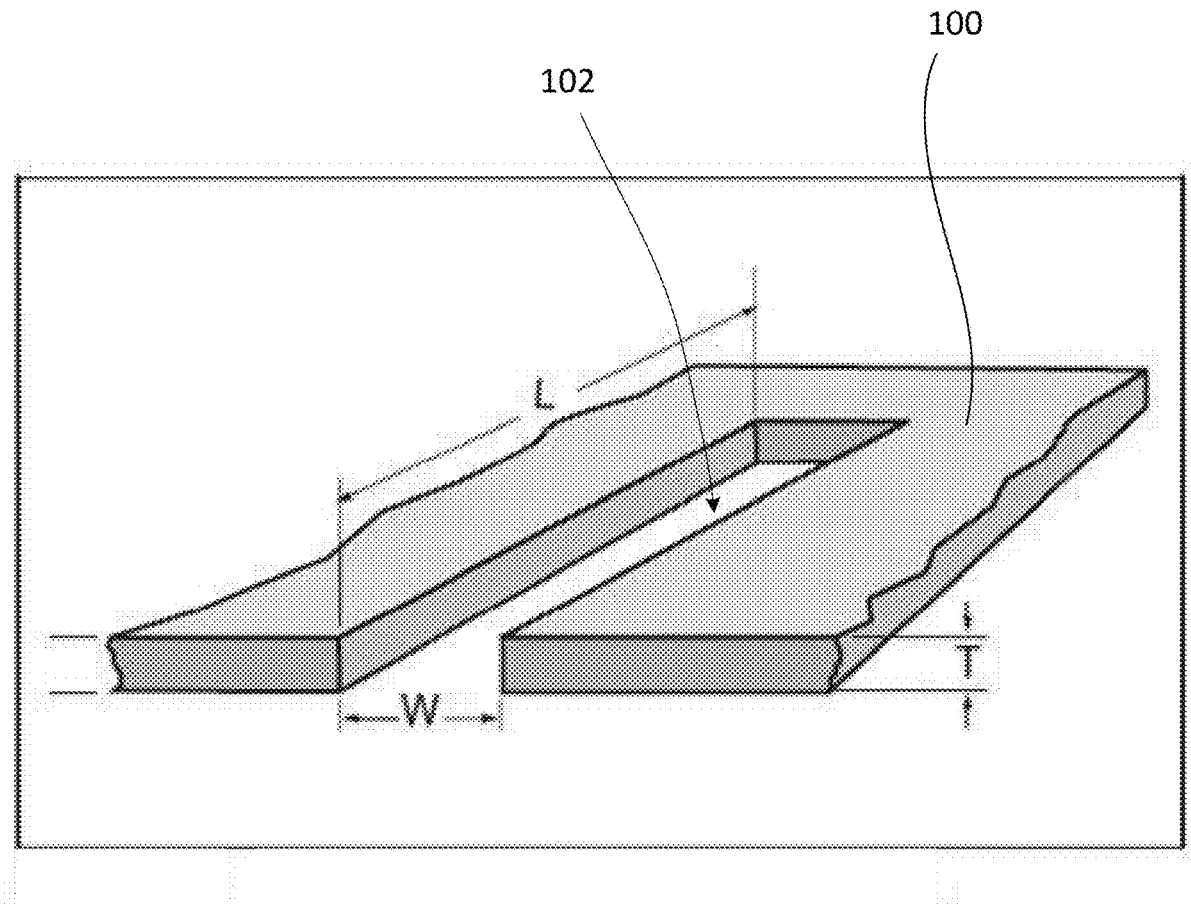
FIG. 1 is a perspective view of the basic structure of an example single layer stencil.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes multilayer stencil devices. In particular, the present disclosure describes stencils that have two or more layers. The multiple layers of the stencil may be removed in sequence to reduce or minimize any quality problems related to printing solder paste.

During the process of solder paste (or glue, or other thermal interface materials (TIM)) printing, the removal of the stencil after application of the solder paste may cause peaks or dog ears to form on the top side of the remaining solder paste, which can result in an uneven shape. Due to the peaking or dog ear phenomenon, the solder paste on the printed circuit board (PCB) may not be well formed, the smear area may be too large, and the distance between solder joints may be too small. Reasons that lead to this dog ear effect may be that the stencil is not smooth enough, the size of the stencil is too large, the de-molding speed is to large, the PCB solder joints are polluted, the solder paste quality may be very poor, or the stencil is not cleaned well. Certain methods to minimize or reduce the occurrence of the dog ear effects on the solder paste may include cleaning or replacing the stencil, cleaning or replacing the PCB, adjusting certain printing parameters, and replacing the poor quality solder paste with better quality solder paste. These attempts may not solve the problem well, and they may waste cycle time, manpower and material resources. Surface mount technology (SMT) solder paste printing may directly affect the quality of the printed circuit board assembly (PCBA) function. Therefore, it may be desirable to reduce or otherwise lessen one or more of the effects described above.

In certain embodiments, a multilayer stencil includes three or more stacked layers. The number of layers may depend on the properties and the requirements of different products. The multilayer stencil may be integrated as a whole in a device, and it may be connected to an automatic drive device embedded in the printing machine. In certain embodiments, the delamination of the multilayer stencil is performed by the automatic drive engine after printing. The multilayered stencil of the present embodiments may reduce or eliminate the problems related to the peaked or dog eared shape of the final solder paste after stencil removal.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Referring now to the drawings in which like numerals represent the same or similar elements and initially to FIG. 1, this figure shows a perspective view of the basic structure of an example of a single layer stencil 100. In this example, the stencil 100 has an aperture 102 having a length (L) and a width (W), and the stencil 100 has a thickness (T). An aspect ratio of the aperture 102 may be defined as the width of the aperture divided by the thickness of the aperture (W/T). An area ratio of the aperture may be defined as the area of the aperture (L×W) divided by the area of the aperture walls (2×(L+W)×T). In general, to achieve a good stencil release result with a single layer stencil 100, an IPC-7525 standard review (i.e., a stencil design guideline) suggests that the aspect ratio of the aperture is at least 1.3, and the area ratio is at least 0.66. Thus, based on these formulae, it is apparent that the thickness (T) of the stencil is one factor in determining whether a stencil application may be successful. In general, the thickness (T) of the stencil 100 is dictated by the particular application of whatever product is being manufactured. Also, in general, excessive thickness (T) of the stencil may result in the dog ear phenomenon of the solder paste, as discussed above.

Figure 2A:
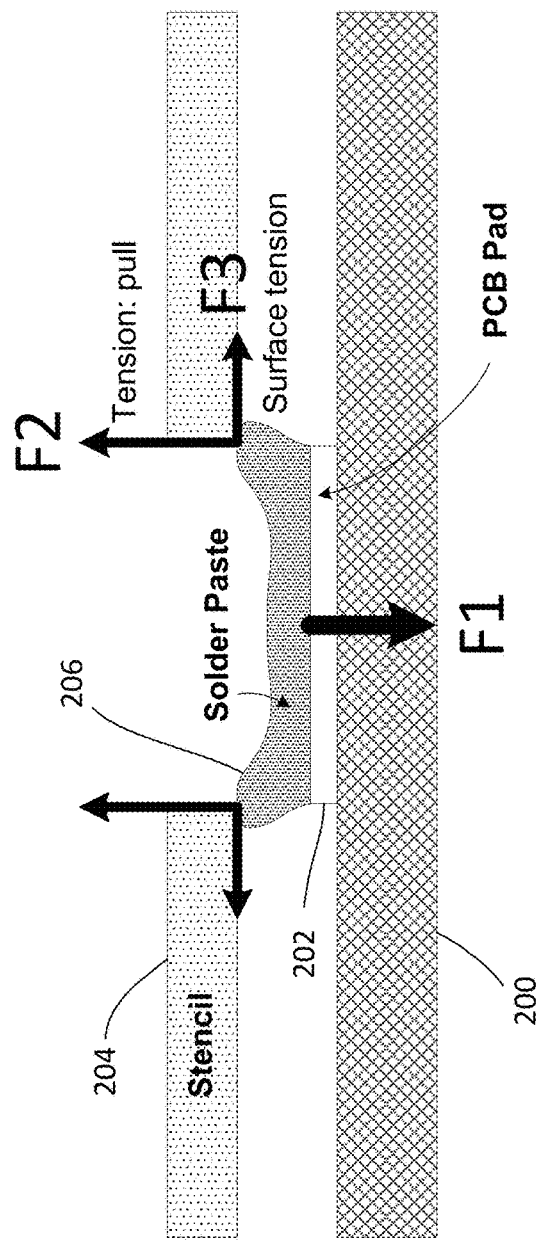
FIG. 2A is a cross-sectional side view of an example stencil and a force diagram of solder paste at the time of the single layer stencil removal.

Referring now to FIG. 2A, this figure shows a cross-sectional side view of an example single layer stencil 204 and a force diagram applied to the solder paste 206 at the time of the single layer stencil 204 removal. In particular, a PCB board 200 is shown with a PCB pad 202 formed thereon. The solder paste 206 is formed on the PCB pad 202. In this example, the stencil 204 has an aperture in the middle portion thereof, which corresponds to where the solder paste 206 was deposited. At the stage of manufacture shown in FIG. 2A, the stencil 204 is being removed from the PBC board 200 in an upward direction. At the upper right and left sides of the solder paste 206 several forces are exerted on the paste. A first force F1 is in the downward direction, and this is generally the adhesion of the solder paste 206 on the PCB pad 202. A second force F2 is in the upward direction, and this force is generally caused by the adhesion or friction of the stencil 204 on the solder paste 206 when the stencil 204 is being pulled upward. A third force F3 is in an outward lateral direction on both the top right and top left of the stencil 204, and this force may be related to a surface tension of the solder paste 206. The combination of these forces may cause the dog ear phenomenon 208, which is shown in photograph of the solder paste 206 of FIG. 2B. During separation (stencil 204 lifting), the solder paste 206 have forces holding the paste to the PCB pad 202, and the forces combine by pulling up the edge of the solder paste 206 and the surface tension/adsorption holding to solder paste 206 to the stencil 204 walls. In a worst case scenario which with a large surface tension, the solder paste 206 will stretch and tear (i.e., to form a dog ear shape) and then a portion of the solder paste 206 may actually stick to the stencil 204.

Figure 3A:
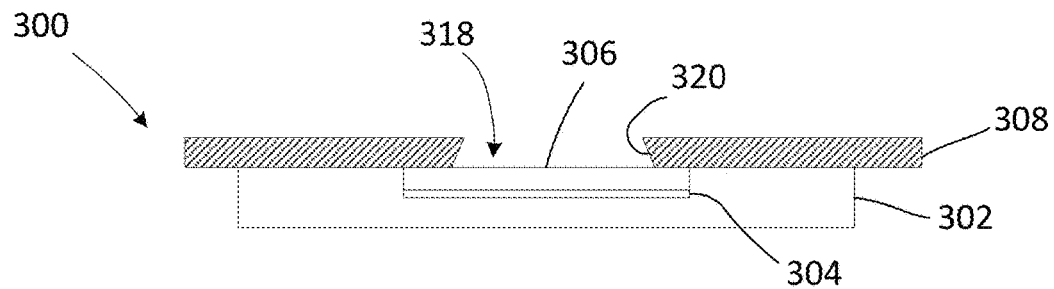
FIG. 3A is a cross-sectional side view of a multilayer stencil at an intermediate stage or the manufacturing process, according to embodiments.

Referring now to FIGS. 3A-3D, a process for forming a multilayer stencil 300 and providing the solder paste 314 thereto is shown. FIG. 3A is a cross-sectional side view of the multilayer stencil 300 at an intermediate stage or the manufacturing process, according to embodiments. In FIG. 3A, a substrate 302 (e.g., a PCB board) is provided. A PCB pad may include a first PCB pad layer 304 and a second PCB pad layer 306. However, it should be appreciated that the PCB pad may have a single layer or any other suitable number of layers other than two. A first stencil layer 308 is placed on the surface of the PCB board 304. In certain embodiments, an aperture 318 is formed in the stencil, and this aperture 318 is generally over the location of the PCB pad layers 306. In certain embodiments, inner sidewalls of the first stencil layer 308 have a tapered shape that is tapered inwardly from a bottom side of the first stencil layer 308 to a top side thereof. This may allow for easier release of the multilayer stencil 300 from the solder paste (i.e., as opposed to a vertical inner sidewall). However, in other embodiments, the inner sidewalls of the aperture 318 of the first stencil layer 308 may have a vertical profile.

Figure 3B:
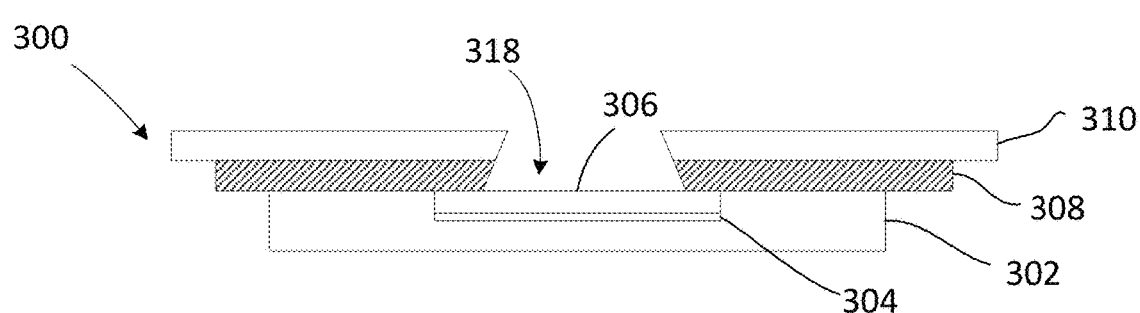
FIG. 3B is a cross-sectional side view of the multilayer stencil of FIG. 3A after additional fabrication operations, according to embodiments.

Referring now to FIG. 3B, this figure shows a cross-sectional side view of the multilayer stencil of FIG. 3A after additional fabrication operations, according to embodiments. In particular, a second stencil layer 310 is provided on top of the first stencil layer 308. The second stencil layer 310 is provided with a corresponding aperture, and aperture profile (i.e., position and inner sidewall slant) to that of the first stencil layer 308. However, because of the inward taper shape of the sidewalls of the stencil layers, the aperture size of the second stencil layer 310 is slightly less than the aperture size of the first stencil layer 308. In certain embodiments, the second stencil layer 310 is separable from the first stencil layer 308. Thus, in a subsequent stencil removal operation described below, the second stencil layer 310 may be separated from the first stencil layer 308 and be removed prior to the removal of the first stencil layer 308. In certain embodiments, an overall width of the second stencil layer 310 is greater than an overall width of the first stencil layer 308 such that edges of the second stencil layer 310 overhang (i.e., extend beyond) the edges of the first stencil layer 308.

Figure 3C:
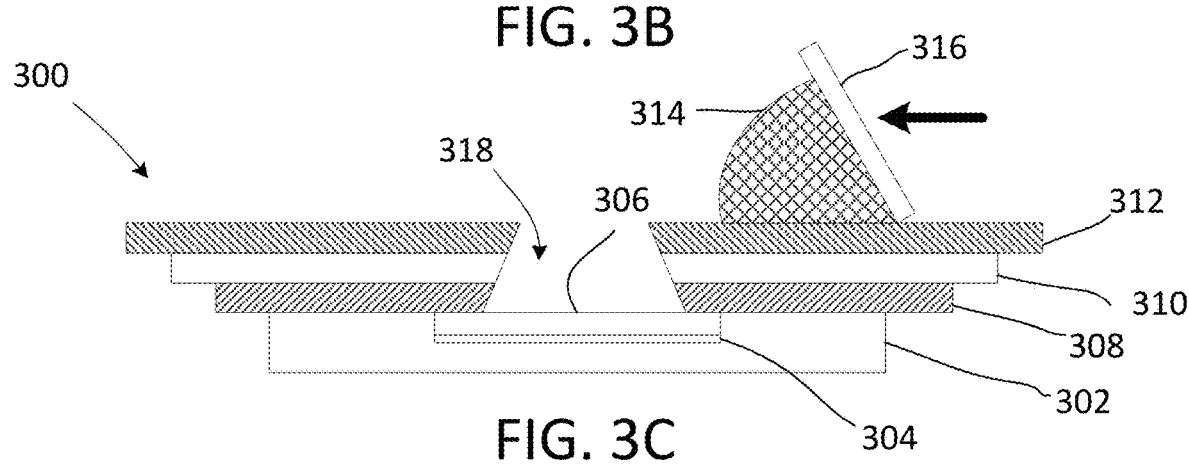
FIG. 3C is a cross-sectional side view of the multilayer stencil of FIG. 3B after additional fabrication operations and prior to solder paste application, according to embodiments.

Referring now to FIG. 3C, this figure shows a cross-sectional side view of the multilayer stencil of FIG. 3B after additional fabrication operations, according to embodiments. In particular, a third stencil layer 312 is provided on top of the second stencil layer 310. The third stencil layer 312 is provided with a corresponding aperture, and aperture profile (i.e., position and inner sidewall slant) to that of the second stencil layer 310. However, because of the inward taper shape of the sidewalls of the stencil layers, the aperture size of the third stencil layer 312 is slightly less than the aperture size of the second stencil layer 310. In certain embodiments, the third stencil layer 312 is separable from the second stencil layer 310. Thus, in a subsequent stencil removal operation described below, the third stencil layer 312 may be separated from the second stencil layer 310 and be removed prior to the removal of the second stencil layer 310. As also shown in FIG. 3C, a wiper 316 is moved across the surface of the multilayer stencil 300 to apply the solder paste 314 to the aperture. In certain embodiments, an overall width of the third stencil layer 312 is greater than an overall width of the second stencil layer 310 such that edges of the third stencil layer 312 overhang (i.e., extend beyond) the edges of the second stencil layer 310.

Figure 3D:
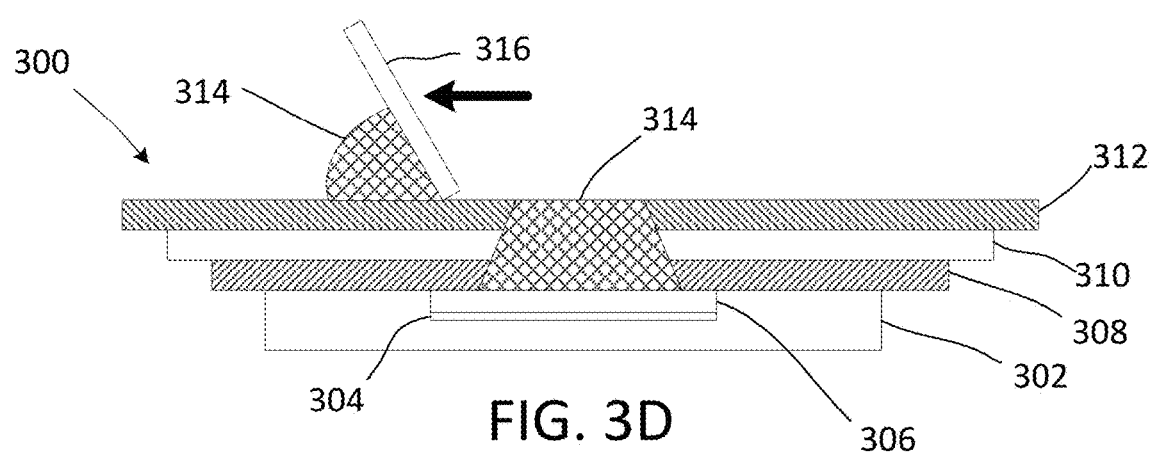
FIG. 3D is a cross-sectional side view of the multilayer stencil of FIG. 3C after additional fabrication operations and after solder paste application, according to embodiments.

FIG. 3D is a cross-sectional side view of the multilayer stencil of FIG. 3C after the solder paste 314 has been urged into the aperture 318 formed by the first stencil layer 308, the second stencil layer 310 and the third stencil layer 312, according to embodiments. The resulting shape of the solder paste 314 is a generally trapezoidal shape that corresponds to the shape of the previously formed aperture 318. This trapezoidal shape of the solder paste 314 has a bottom surface having a width that is less than width of a top surface thereof.

Figure 4A:
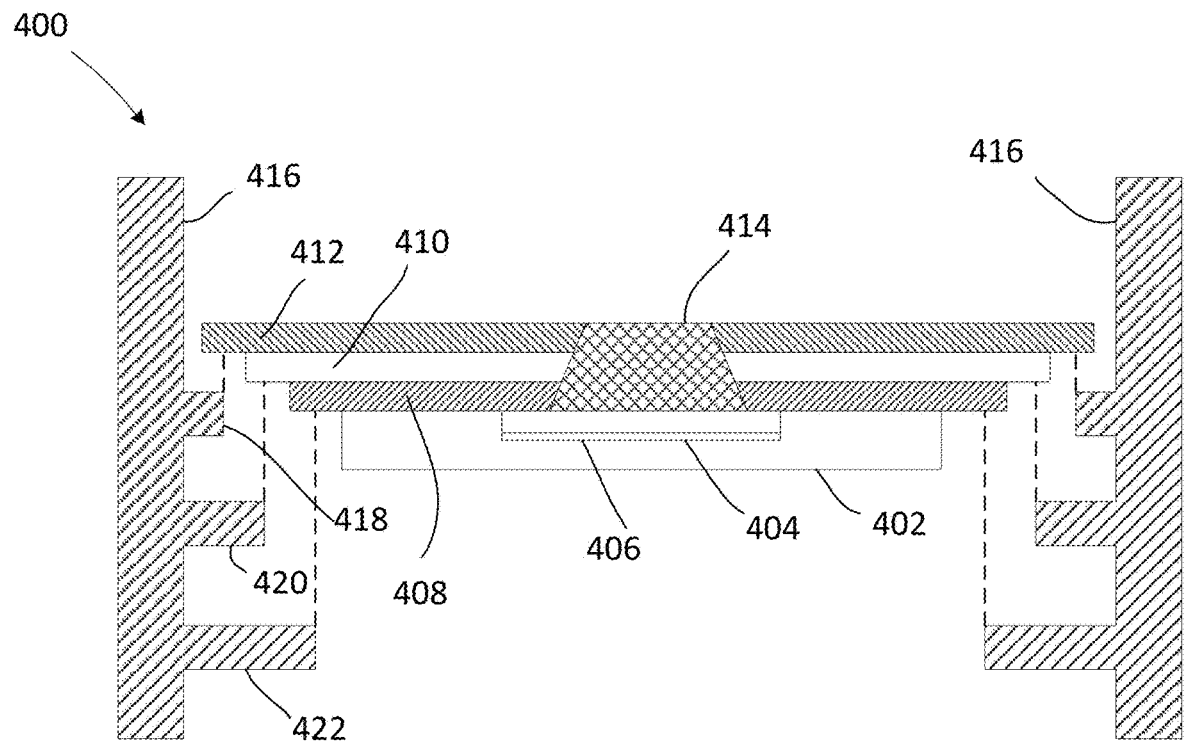
FIG. 4A is a cross-sectional side view of the multilayer stencil of FIG. 3D prior to the stencil removal, according to embodiments.

Referring now to FIGS. 4A-4D, a process for removing the multilayer stencil 300 with a lifter 416 is shown. FIG. 4A is a cross-sectional side view of the multilayer stencil of FIG. 3D prior to the stencil removal, according to embodiments. As shown in FIG. 4A, a substrate 402 (e.g., a PCB board) is provided. A PCB pad may include a first PCB pad layer 404 and a second PCB pad layer 406. A first stencil layer 408, a second stencil layer 410 and a third stencil layer 412 are provided on the PCB board 402. Also, solder paste 414 is formed in the apertures of the respective layers of the multilayer stencil 400. A lifter 416 is provided to aid in removal of the first stencil layer 408, the second stencil layer 410 and the third stencil layer 412. The lifter 416 may include a plurality of lifting bars. A first lifting bar 422 is provided to remove the first stencil layer 408, a second lifting bar 420 is provided to remove the second stencil layer 410, and a third lifting bar 418 is provided to remove the third stencil layer 412. In particular, the third lifting bar 418 is a protrusion (or other extending member) that extends inwardly from each side of the lifter 416 to overlap with the third stencil layer 412 (indicated by the dashed lines connecting the third lifting bar 418 to the third stencil layer 412). It should be appreciated that the third lifting bar 418 does not protrude inwardly enough to overlap with any portion of either the second stencil layer 410 or the first stencil layer 408. Also, the second lifting bar 420 is a protrusion (or other extending member) that extends inwardly from each side of the lifter 416 to overlap with the third stencil layer 412 and the second stencil layer 410 (indicated by the dashed lines connecting the second lifting bar 420 to the second stencil layer 410). It should be appreciated that the second lifting bar 420 does not protrude inwardly enough to overlap with any portion of the first stencil layer 408. Also, the first lifting bar 422 is a protrusion (or other extending member) that extends inwardly from each side of the lifter 416 to overlap with the third stencil layer 412, the second stencil layer 410 and the first stencil layer 408 (indicated by the dashed lines connecting the first lifting bar 422 to the first stencil layer 408).

Figure 4B:
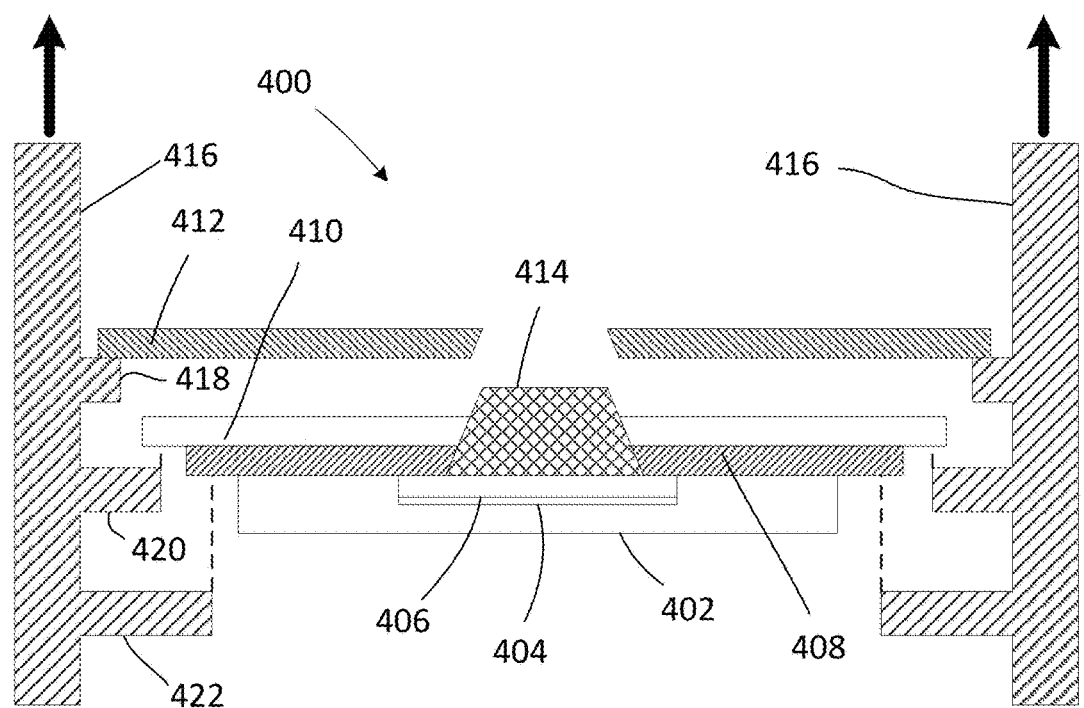
FIG. 4B is a cross-sectional side view of the multilayer stencil of FIG. 4A after a first layer of the multilayer stencil has been removed, according to embodiments.

FIG. 4B is a cross-sectional side view of the multilayer stencil of FIG. 4A after a first layer of the multilayer stencil has been removed, according to embodiments. An upward motion is applied to the lifter 416 (i.e., as indicated by the arrows in FIG. 4B), and contact is made between the third lifting bar 418 and the third stencil layer 412. However, a sufficient distance exists between the third lifting bar 418 and the second lifting bar 420 such that the second lifting bar 420 does not yet contact the second stencil layer 410 at this stage. As such, only the third stencil layer 412 is removed. As shown in FIG. 4B, after removal of the third stencil layer 412, only a portion of the solder paste 414 corresponding to the thickness of the third stencil layer 412 is revealed.

Figure 2B:
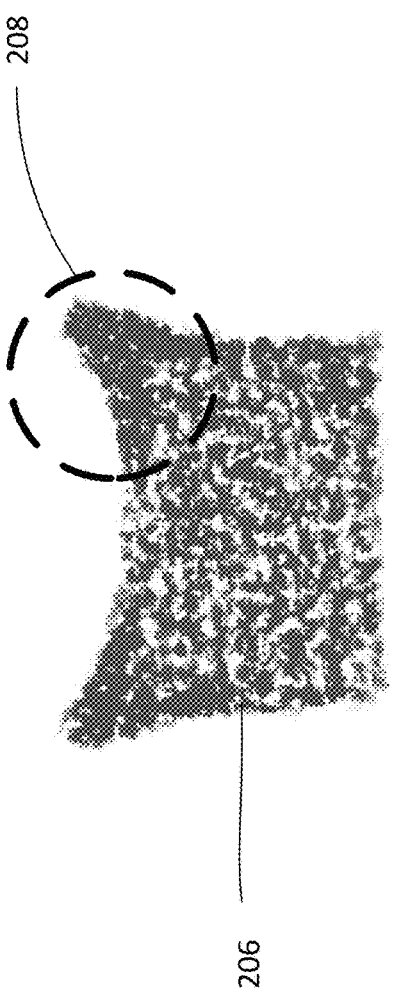
FIG. 2B is a cross-sectional side view image of a shape of the solder paste after stencil removal.

As discussed above with regard to the example of the single layer stencil of FIGS. 1, 2A and 2B, the force analysis illustrated that the dog ear issue may occur if the stencil has a big enough thickness. However, in the present embodiments having a multilayer stencil, because only a portion of thickness of the solder paste is revealed with each stencil layer removal, the force analysis is different. In the multilayer stencil of the present embodiments, the structure may prevent the occurrence of the dog ear phenomenon because a reasonable area ratio is provided for each individual stencil layer per the IPC standard. The forces analysis is different when applying the multilayer stencil in the same scenario. The force holding the solder paste to the PCB pad (F1) will be nearly the same because the it depends on the solder paste volume and the land area. Assuming the same pulling force (F2) is applied, then the only difference will be the surface tension/adsorption force (F3) holding to paste to the stencil walls. The F3 applied to the multilayer stencil of FIGS. 4B, 4C and 4D will be smaller than the F3 applied to the single layer stencil of FIG. 2A, since the stencil wall surface areas are smaller in the multilayer stencil embodiments (e.g., one third of the surface area in the use case of three stencil layers). Therefore, the dog ear effect may be reduced or eliminated in the present embodiments having the multilayered stencil configuration.

Figure 4C:
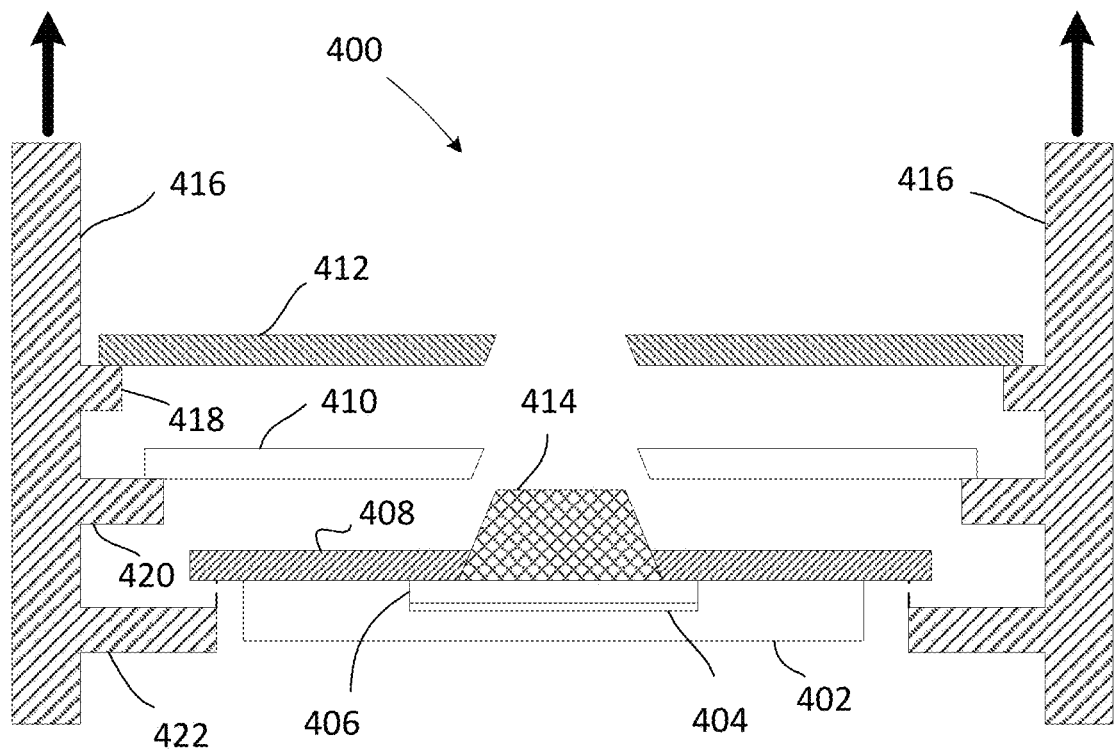
FIG. 4C is a cross-sectional side view of the multilayer stencil of FIG. 4B after a first layer of the multilayer stencil has been removed, according to embodiments.

FIG. 4C is a cross-sectional side view of the multilayer stencil of FIG. 4B after a second layer of the multilayer stencil has been removed, according to embodiments. An upward motion is applied to the lifter 416 (i.e., as indicated by the arrows in FIG. 4C), and contact is made between the second lifting bar 420 and the second stencil layer 410. However, a sufficient distance exists between the second lifting bar 420 and the first lifting bar 422 such that the first lifting bar 418 does not yet contact the first stencil layer 408 at this stage. At this stage, only the third stencil layer 412 and the second stencil layer 410 have been removed. As shown in FIG. 4C, after removal of the second stencil layer 410, an additional portion of the solder paste 414 corresponding to the thickness of the second stencil layer 410 is revealed.

Figure 4D:
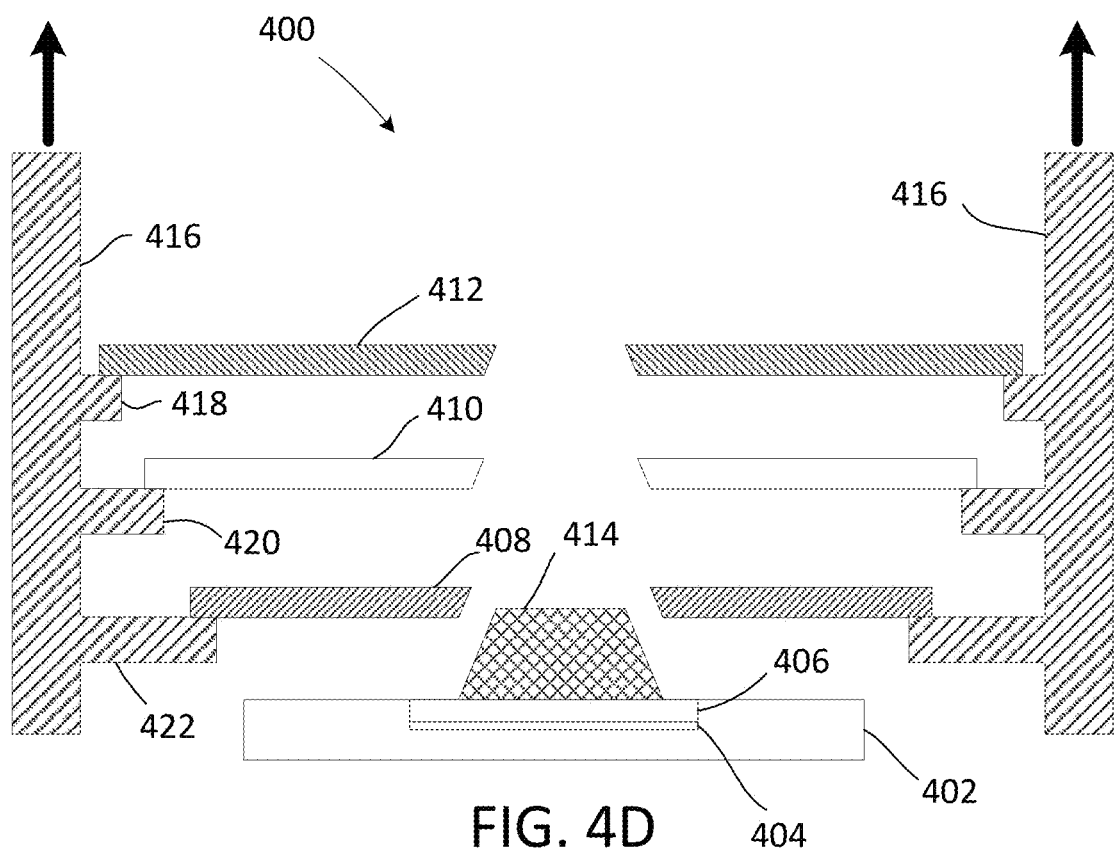
FIG. 4D is a cross-sectional side view of the multilayer stencil of FIG. 4C after a first layer of the multilayer stencil has been removed, according to embodiments.

FIG. 4D is a cross-sectional side view of the multilayer stencil of FIG. 4C after the first stencil layer 408 of the multilayer stencil 400 has been removed, according to embodiments. An upward motion is applied to the lifter 416 (i.e., as indicated by the arrows in FIG. 4D), and contact is made between the first lifting bar 422 and the first stencil layer 408. At this stage, each of the third stencil layer 412, the second stencil layer 410 and the first stencil layer 408 have been removed. As shown in FIG. 4D, after removal of the first stencil layer 408, an additional portion of the solder paste 414 corresponding to the thickness of the first stencil layer 408 is revealed. Thus, the entire solder paste 414 is revealed. In certain embodiments, due to the multiple lifting bar structure of the lifter 416, all three of the stencil layers can be sequentially removed in a single upward motion.

Figure 5:
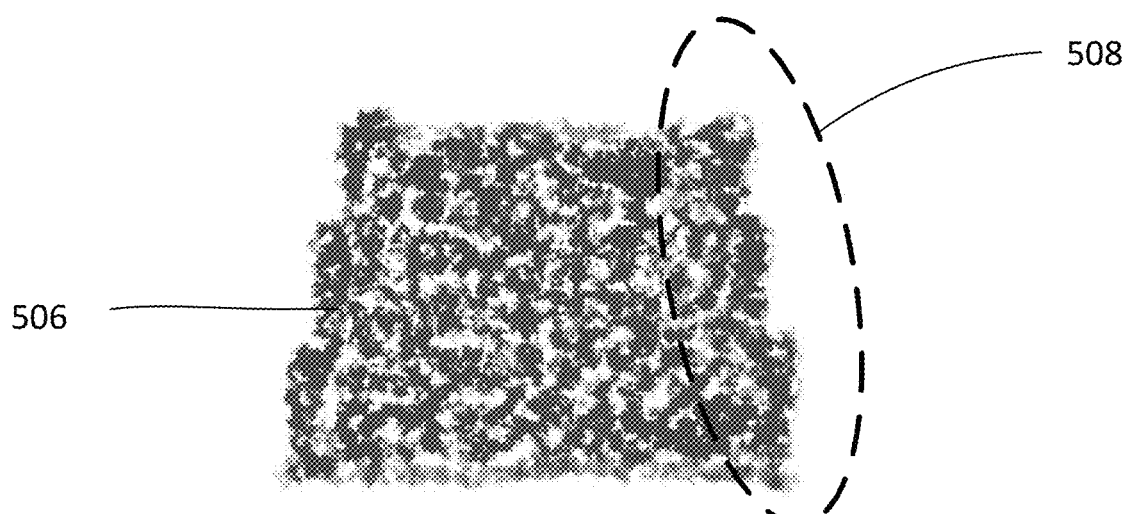
FIG. 5 is a cross-sectional side view image of a shape of the solder paste after the multilayer stencil removal.

FIG. 5 is a cross-sectional side view image of a shape of the solder paste 506 after the multilayer stencil removal. In certain embodiments, the solder paste 506 has a stepped configuration 508 (or ladder shaped configuration) after stencil removal. In other embodiments, the solder paste 506 has a generally trapezoidal shaped configuration. Comparison of the solder paste 506 shown in FIG. 5 to the solder paste shown in FIG. 2B shows a reduction in the occurrence or extent of the dog ear phenomenon.

According to the present embodiments, certain effects may be achieved. In particular, there may not be a need to rework (or even scrap the PCB boards and/or heatsinks), and the present embodiments may reduce the waste of manpower and material resources. The stencils of the present embodiments, may also reduce production cycle time, greatly improve the quality performance of the printing and glue. The processes may be a non-destructive process, and they may achieve a certain level of cost savings. Also, the multilayered stencils and processes of the present embodiments, may be more efficient and user intervention may not be needed.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multilayered stencil for applying solder paste to a surface of an object, the stencil comprising:
a plurality of stencil layers formed in a stacked configuration, each stencil layer having an aperture formed therethrough from a top surface of the respective stencil layer to a bottom surface of the stencil layer,
wherein for a first stencil nearest to the object and having a first aperture, an upper first aperture width is less than a lower first aperture width, and
wherein for a second stencil stacked on the first stencil and having a second aperture, a lower second aperture width is the same as the upper first aperture width, and an upper second aperture width is less than the lower second aperture width.

2. The multilayered stencil of claim 1, wherein the multilayered stencil includes at least three stencil layers.

3. The multilayered stencil of claim 1, wherein widths of the stencil layers gradually increases in the direction away from the surface of the object.

4. The multilayered stencil of claim 1, wherein the apertures for each of the stencil layers are formed at an angle relative to the vertical direction.

5. The multilayered stencil of claim 1, wherein the plurality of apertures have a substantially trapezoidal shape, with an upper portion of the apertures having a width that is less than a width of a lower portion of the apertures.

6. The multilayered stencil of claim 1, wherein the plurality of stencil layers are separable from each other.

7. The multilayered stencil of claim 1, wherein the object is a pad formed on a printed circuit board.

8. The multilayered stencil of claim 1, wherein the multilayered stencil includes at least four stencil layers.

9. The multilayered stencil of claim 1, wherein the stencil layers are formed from at least one material selected from the group consisting of a polymer, stainless steel, nickel, a nickel alloy, a plastic, and a resin.

* * * * *